United States Patent
Perlmutter et al.

(10) Patent No.: US 8,209,588 B2
(45) Date of Patent: Jun. 26, 2012

(54) EFFICIENT INTERFERENCE CANCELLATION IN ANALOG MEMORY CELL ARRAYS

(75) Inventors: Uri Perlmutter, Holon (IL); Yoav Kasorla, Seoul (KR); Oren Golov, Hod Hasharon (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 748 days.

(21) Appl. No.: 12/332,368

(22) Filed: Dec. 11, 2008

(65) Prior Publication Data

US 2009/0158126 A1 Jun. 18, 2009

Related U.S. Application Data

(60) Provisional application No. 61/013,027, filed on Dec. 12, 2007, provisional application No. 61/013,032, filed on Dec. 12, 2007, provisional application No. 61/016,566, filed on Dec. 25, 2007.

(51) Int. Cl.
  *G06F 11/10* (2006.01)
(52) U.S. Cl. ...................................... 714/773
(58) Field of Classification Search .................... 714/773
  See application file for complete search history.

(56) References Cited

U.S. PATENT DOCUMENTS

| | | | |
|---|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |

(Continued)

FOREIGN PATENT DOCUMENTS

EP   0783754 B1   7/1997

(Continued)

OTHER PUBLICATIONS

Wei, L. "Trellis-Coded Modulation With Multidimensional Constellations", IEEE Transactions on Information Theory, vol. IT-33, No. 4, pp. 483-501, Jul. 1987.

(Continued)

*Primary Examiner* — Amine Riad
(74) *Attorney, Agent, or Firm* — D. Kligler I.P. Services Ltd.

(57) ABSTRACT

A method includes storing data in a group of analog memory cells by writing first storage values to the cells. After storing the data, second storage values are read from the cells using one or more first read thresholds. Third storage values that potentially cause cross-coupling interference in the second storage values are identified, and the third storage values are processed, to identify a subset of the second storage values as severely-interfered values. Fourth storage values are selectively re-read from the cells holding the severely-interfered values using one or more second read thresholds, different from the first read thresholds. The cross-coupling interference in the severely-interfered storage values is canceled using the re-read fourth storage values. The second storage values, including the severely-interfered values in which the cross-coupling interference has been canceled, are processed so as to reconstruct the data stored in the cell group.

28 Claims, 3 Drawing Sheets

U.S. PATENT DOCUMENTS

| | | | |
|---|---|---|---|
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotta et al. | |
| 5,182,558 A | 1/1993 | Mayo | |
| 5,182,752 A | 1/1993 | DeRoo et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,446,854 A | 8/1995 | Khalidi et al. | |
| 5,450,424 A | 9/1995 | Okugaki et al. | |
| 5,469,444 A | 11/1995 | Endoh et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,533,190 A | 7/1996 | Binford et al. | |
| 5,541,886 A | 7/1996 | Hasbun | |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | De Koning | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,798,966 A | 8/1998 | Keeney | |
| 5,799,200 A | 8/1998 | Brant et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,428 A | 2/1999 | Ishii et al. | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,946,716 A | 8/1999 | Karp et al. | |
| 5,969,986 A | 10/1999 | Wong et al. | |
| 5,982,668 A | 11/1999 | Ishii et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,009,016 A | 12/1999 | Ishii et al. | |
| 6,023,425 A | 2/2000 | Ishii et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,151,246 A | 11/2000 | So et al. | |
| 6,157,573 A | 12/2000 | Ishii et al. | |
| 6,166,962 A | 12/2000 | Chen et al. | |
| 6,169,691 B1 | 1/2001 | Pasotti et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,259,627 B1 | 7/2001 | Wong | |
| 6,275,419 B1 | 8/2001 | Guterman et al. | |
| 6,278,632 B1 | 8/2001 | Chevallier | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,314,044 B1 | 11/2001 | Sasaki et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,385,092 B1 | 5/2002 | Ishii et al. | |
| 6,392,932 B1 | 5/2002 | Ishii et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,405,342 B1 | 6/2002 | Lee | |
| 6,418,060 B1 | 7/2002 | Yong et al. | |
| 6,442,585 B1 | 8/2002 | Dean et al. | |
| 6,445,602 B1 | 9/2002 | Kokudo et al. | |
| 6,452,838 B1 | 9/2002 | Ishii et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,480,948 B1 | 11/2002 | Virajpet et al. | |
| 6,490,236 B1 | 12/2002 | Fukuda et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,549,464 B2 | 4/2003 | Tanaka et al. | |
| 6,553,510 B1 | 4/2003 | Pekny et al. | |
| 6,558,967 B1 | 5/2003 | Wong | |
| 6,560,152 B1 | 5/2003 | Cernea | |
| 6,567,311 B2 | 5/2003 | Ishii et al. | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzales et al. | |
| 6,640,326 B1 | 10/2003 | Buckingham et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,683,811 B2 | 1/2004 | Ishii et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,732,250 B2 | 5/2004 | Durrant | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,804,805 B2 | 10/2004 | Rub | |
| 6,807,095 B2 | 10/2004 | Chen et al. | |

| Patent | Kind | Date | Inventor(s) |
|---|---|---|---|
| 6,807,101 | B2 | 10/2004 | Ooishi et al. |
| 6,809,964 | B2 | 10/2004 | Moschopoulos et al. |
| 6,819,592 | B2 | 11/2004 | Noguchi et al. |
| 6,829,167 | B2 | 12/2004 | Tu et al. |
| 6,845,052 | B1 | 1/2005 | Ho et al. |
| 6,851,018 | B2 | 2/2005 | Wyatt et al. |
| 6,851,081 | B2 | 2/2005 | Yamamoto |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,870,773 | B2 | 3/2005 | Noguchi et al. |
| 6,873,552 | B2 | 3/2005 | Ishii et al. |
| 6,879,520 | B2 | 4/2005 | Hosono et al. |
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 | 2/2006 | Noguchi et al. |
| 7,012,835 | B2 | 3/2006 | Gonzales et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,145,805 | B2 | 12/2006 | Ishii et al. |
| 7,151,692 | B2 | 12/2006 | Wu |
| 7,158,058 | B1 | 1/2007 | Yu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,184,338 | B2 | 2/2007 | Nakagawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzawa |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhlesi et al. |
| 7,310,347 | B2 | 12/2007 | Lasser |
| 7,312,727 | B1 | 12/2007 | Feng et al. |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 | 8/2008 | Baker et al. |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobetz et al. |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,469,049 | B1 | 12/2008 | Feng |
| 7,471,581 | B2 | 12/2008 | Tran et al. |
| 7,483,319 | B2 | 1/2009 | Brown |
| 7,487,329 | B2 | 2/2009 | Hepkin et al. |
| 7,487,394 | B2 | 2/2009 | Forhan et al. |
| 7,492,641 | B2 | 2/2009 | Hosono et al. |
| 7,508,710 | B2 | 3/2009 | Mokhlesi |
| 7,526,711 | B2 | 4/2009 | Orio |
| 7,539,061 | B2 | 5/2009 | Lee |
| 7,539,062 | B2 | 5/2009 | Doyle |
| 7,551,492 | B2 | 6/2009 | Kim |
| 7,558,109 | B2 | 7/2009 | Brandman et al. |
| 7,558,839 | B1 | 7/2009 | McGovern |
| 7,568,135 | B2 | 7/2009 | Cornwell et al. |
| 7,570,520 | B2 | 8/2009 | Kamei et al. |
| 7,574,555 | B2 | 8/2009 | Porat et al. |
| 7,590,002 | B2 | 9/2009 | Mokhlesi et al. |
| 7,593,259 | B2 | 9/2009 | Kim et al. |
| 7,594,093 | B1 | 9/2009 | Kancherla |
| 7,596,707 | B1 | 9/2009 | Vemula |

| Patent/Pub No. | Date | Inventor |
|---|---|---|
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |

| | | | |
|---|---|---|---|
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1* | 6/2009 | Perlmutter et al. ........... 714/763 |
| 2009/0150894 A1 | 6/2009 | Huang et al. |
| 2009/0157950 A1 | 6/2009 | Selinger |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0204824 A1 | 8/2009 | Lin et al. |
| 2009/0204872 A1 | 8/2009 | Yu et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. # 13/114,049 Official Action dated Sep 12, 2011.
U.S. Appl. No. # 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. # 12/037,487 Official Action dated Oct. 3, 2011.
U.S. Appl. No. # 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed Jun. 24, 2010.

U.S. Appl. No. 12/534,898 Official Action dated Mar. 23, 2011.

U.S. Appl. No. 13/047,822, filed Mar. 15, 2011.

U.S. Appl. No. 13/069,406, filed Mar. 23, 2011.

U.S. Appl. No. 13/088,361, filed Apr. 17, 2011.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), p. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search Report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
International Application PCT/IL2008/001446 "Optimized selection of memory chips in multi-chip memory devices" filed on Nov. 4, 2008.
Shalvi et al., U.S. Appl. No. 12/251,471 "Compensation for Voltage Drifts in Analog Memory Cells" filed Oct. 15, 2008.
Kasorla et al, U.S. Appl. No. 12/332,370 "Efficient Data Storage in Multi-Plane Memory Devices" filed Dec. 11, 2008.
Sommer, N., U.S. Appl. No. 12/364,531 "Parameter Estimation Based on Error Correction Code Parity Check Equations" filed Feb. 3, 2009.
Golov et al., U.S. Appl. No. 12/344,233 "Wear Level Estimation in Analog Memory Cells" filed Dec. 25, 2008.
Perlmutter et al., U.S. Appl. No. 12/388,528 "Programming of Analog Memory Cells Using a Single Programming Pulse per State Transition" filed Feb. 19, 2009.
Perlmutter et al., U.S. Appl. No. 12/390,522 "Programming Analog Memory Cells for Reduced Variance After Retention" filed Feb. 23, 2009.
Perlmutter et al., U.S. Appl. No. 12/405,275 "Memory Device with Multiple-Accuracy Read Commands" filed Mar. 17, 2009.
Perlmutter et al., U.S. Appl. No. 12/397,368 "Efficient Readout from Analog Memory Cells Using Data Compression" filed Mar. 4, 2009.
Sommer, N., U.S. Appl. No. 12/171,797 "Memory Device with Non-Uniform Programming Levels" filed Jul. 11, 2008.
U.S. Appl. No. 11/949,135 Official Action dated Oct. 2, 2009.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
UBUNTU Forums, "Memory Stick Failed IO Superblock", posted Nov. 11, 2009.
Super User Forums, "SD Card Failure, can't read superblock", posted Aug. 8, 2010.
U.S. Appl. No. 12/987,174 "Redundant Data Storage in Multi-Die Memory Systems", filed Jan. 10, 2011.
U.S. Appl. No. 12/987,175 "Redundant Data Storage Schemes for Multi-Die Memory Systems" filed Jan. 10, 2011.
U.S. Appl. No. 12/963,649 "Memory Management Schemes for Non-Volatile Memory Devices" filed on Dec. 9, 2010.
U.S. Appl. No. 13/021,754 "Reducing Peak Current in Memory Systems" filed Feb. 6, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
U.S. Appl. No. 12/323,544 Office Action dated Dec. 13, 2011.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model-5 (SAM-5)", INCITS document T10/2104-D, revision 01, Jan. 28, 2009.
SAS Protocol, "Information Technology—Serial Attached SCSI-2 (SAS-2)", INCITS document T10/1760-D, revision 15a, Feb. 22, 2009.
US 7,161,836, 01/2007, Wan et al. (withdrawn)

* cited by examiner

EFFICIENT INTERFERENCE CANCELLATION IN ANALOG MEMORY CELL ARRAYS

CROSS-REFERENCE TO RELATED APPLICATIONS

This application claims the benefit of U.S. Provisional Patent Application 61/013,027, filed Dec. 12, 2007, U.S. Provisional Patent Application 61/013,032, filed Dec. 12, 2007, and U.S. Provisional Patent Application 61/016,566, filed Dec. 25, 2007, whose disclosures are incorporated herein by reference.

FIELD OF THE INVENTION

The present invention relates generally to memory devices, and particularly to methods and systems for interference cancellation in arrays of analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24th International Conference on Microelectronics (MIEL), Nis, Serbia and Montenegro, May 16-19, 2004, volume 1, pages 377-384, which is incorporated herein by reference.

The storage values held in analog memory cells are sometimes distorted by cross-coupling interference from other memory cells. Various techniques for reducing cross-coupling effects are known in the art. For example, PCT International Publication WO 2007/132453, whose disclosure is incorporated herein by reference, describes a method for operating a memory. Data is stored in a group of analog memory cells as respective first voltage levels. After storing the data, second voltage levels are read from the respective analog memory cells. The second voltage levels are affected by cross-coupling interference causing the second voltage levels to differ from the respective first voltage levels. Cross-coupling coefficients, which quantify the cross-coupling interference among the analog memory cells, are estimated by processing the second voltage levels. The data stored in the group of analog memory cells is reconstructed from the read second voltage levels using the estimated cross-coupling coefficients.

As another example, PCT International Publication WO 2007/132457, whose disclosure is incorporated herein by reference, describes a method for operating a memory device. Data is encoded using an Error Correction Code (ECC) and the encoded data is stored as first analog values in respective analog memory cells of the memory device. After storing the encoded data, second analog values are read from the respective memory cells in which the encoded data were stored. At least some of the second analog values differ from the respective first analog values. A distortion that is present in the second analog values is estimated. Error correction metrics are computed with respect to the second analog values responsively to the estimated distortion. The second analog values are processed using the error correction metrics in an ECC decoding process, so as to reconstruct the data.

Analog memory cell arrays are typically divided into pages, such that data is written to or read from the memory cells of a given page simultaneously. Some known techniques, however, access memory cells at a finer granularity. For example, U.S. Patent Application Publication 2006/0271748, whose disclosure is incorporated herein by reference, describes systems and methods for memory management. The disclosed methods detect a request to activate a memory portion, which is limited in size to a partial page size, where the partial page size is less than a full page size associated with the memory. In one embodiment, detecting the request includes identifying a row address and partial page address associated with the request, where the partial page address indicates that the memory portion is to be limited to the partial page size.

U.S. Pat. No. 6,101,614, whose disclosure is incorporated herein by reference, describes a method and apparatus for automatically scrubbing Error Correction Code (ECC) errors in memory upon the detection of a correctable error in data read from memory. A memory controller includes memory control logic for controlling accesses to memory, an ECC error checking and correcting unit for checking data read from memory for errors and for correcting any correctable errors found in the read data, a first data buffer for storing the corrected read data output from the ECC error checking and correcting unit, and a write-back path having an input end coupled to an output of the first data buffer and an output end coupled to memory. Upon the detection of a correctable error in data read from a particular memory location, the ECC error checking and correcting unit signals to the memory control logic the existence of a correctable error in the read data. The memory control logic then obtains exclusive control over the first data buffer and the write-back path to control writing of the corrected read data onto the write-back path and subsequently to memory.

Data is often read from analog memory cells by comparing the storage values of the cells to one or more read thresholds. In some known methods, the cells are read using multiple read thresholds. For example, PCT International Publication WO 2008/053472, whose disclosure is incorporated herein by reference, describes a method for operating a memory that includes multiple analog memory cells. The method includes storing data, which is encoded with an ECC, in the analog memory cells by writing respective analog input values selected from a set of nominal values to the cells. The stored data is read by performing multiple read operations that compare analog output values of the analog memory cells to different, respective read thresholds so as to produce multiple comparison results for each of the analog memory cells. Soft metrics are computed responsively to the multiple comparison results. The ECC is decoded using the soft metrics, so as to extract the data stored in the analog memory cells.

SUMMARY OF THE INVENTION

An embodiment of the present invention provides a method for operating a memory that includes analog memory cells, the method including:

storing data in a group of the analog memory cells by writing respective first storage values to the memory cells in the group;

after storing the data, reading respective second storage values from the memory cells in the group using one or more first read thresholds;

identifying third storage values that potentially cause cross-coupling interference in the second storage values, and processing the third storage values so as to identify a subset of the second storage values as severely-interfered storage values;

selectively re-reading respective fourth storage values from the memory cells holding the severely-interfered storage values using one or more second read thresholds, different from the first read thresholds;

canceling the cross-coupling interference in the severely-interfered storage values using the re-read fourth storage values; and processing the second storage values, including the severely-interfered storage values in which the cross-coupling interference has been canceled, so as to reconstruct the data stored in the group of the memory cells.

In some embodiments, storing the data includes encoding the data with an Error Correction Code (ECC), reading the second storage values includes decoding the ECC, and the method further includes re-reading the fourth storage values and canceling the cross-coupling interference responsively to a failure in decoding the ECC. In an embodiment, processing the third storage values includes calculating respective expected levels of the cross-coupling interference in the second storage values caused by the third storage values, and selecting the severely-interfered storage values responsively to the expected levels.

In another embodiment, storing the data includes programming the memory cells to assume multiple programming levels, reading the second storage values includes comparing the second storage values to a given read threshold that differentiates between first and second adjacent programming levels, and processing the third storage values includes selecting the severely-interfered storage values only from among the second storage values corresponding to the first and second programming levels.

In yet another embodiment, processing the third storage values includes determining a classification of the second storage values into a first subset of the second storage values that are increased due to the cross-coupling interference, and a second subset of the second storage values that are decreased due to the cross-coupling interference, and identifying the severely-interfered storage values responsively to the classification. In still another embodiment, selectively re-reading the fourth storage values includes refraining from re-reading the fourth storage values from at least some of the memory cells that do not hold the severely-interfered storage values.

In a disclosed embodiment, selectively re-reading the fourth storage values includes transferring the fourth storage values from the memory cells over an interface to a controller, and canceling the cross-coupling interference includes canceling the cross-coupling interference in the controller. Transferring the fourth storage values may include transferring over the interface only the fourth storage values that were re-read from the memory cells holding the severely-interfered storage values. Selectively re-reading the fourth storage values sometimes includes sensing the fourth storage values of all the memory cells in the group. Alternatively, selectively re-reading the fourth storage values may include refraining from sensing the fourth storage values of the memory cells that do not hold the severely-interfered storage values.

In an embodiment, selectively re-reading the fourth storage values includes sending from the controller over the interface an instruction to enter a predefined reading mode, the instruction indicating the group of the memory cells from which the fourth storage values are to be re-read when operating in the predefined mode. In a disclosed embodiment, when operating in the predefined reading mode, selectively re-reading the fourth storage values includes sending from the controller read requests specifying respective addresses of the fourth storage values within the group, and re-reading the fourth storage values responsively to the read requests. Sending the read requests may include specifying a given address of a given fourth storage value requested in a given read request by specifying in the given read request an offset of the given address from a previous address of a previous fourth storage value requested in a previous read request that precedes the given read request.

In another embodiment, identifying and processing the third storage values include sending from the controller over the interface a criterion for identifying the severely-interfered storage values based on the third storage values, and identifying the severely-interfered storage values responsively to the criterion.

There is additionally provided, in accordance with an embodiment of the present invention, a data storage apparatus, including:

a memory, which includes a plurality of analog memory cells; and circuitry, which is coupled to store data in a group of the analog memory cells by writing respective first storage values to the memory cells in the group, to read respective second storage values from the memory cells in the group using one or more first read thresholds after storing the data, to identify third storage values that potentially cause cross-coupling interference in the second storage values, to process the third storage values so as to identify a subset of the second storage values as severely-interfered storage values, to electively re-read respective fourth storage values from the memory cells holding the severely-interfered storage values using one or more second read thresholds, different from the first read thresholds, to cancel the cross-coupling interference in the severely-interfered storage values using the re-read fourth storage values, and to process the second storage values, including the severely-interfered storage values in which the cross-coupling interference has been canceled, so as to reconstruct the data stored in the group of the memory cells.

The present invention will be more fully understood from the following detailed description of the embodiments thereof, taken together with the drawings in which:

DETAILED DESCRIPTION OF EMBODIMENTS

Overview

Figure 1:
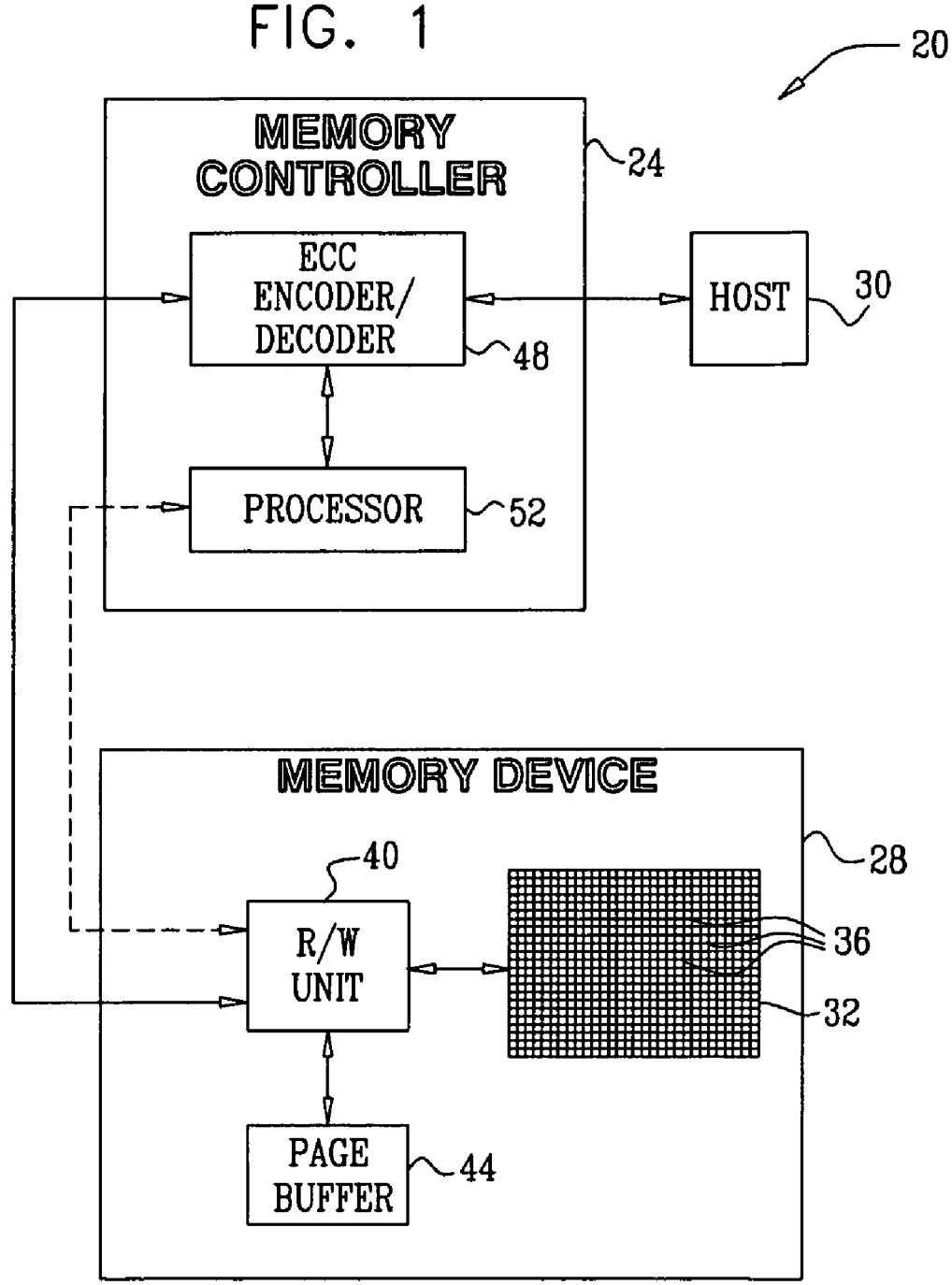
FIG. 1 is a block diagram that schematically illustrates a memory system, in accordance with an embodiment of the present invention.

When data is retrieved from analog memory cells, errors may occur as a result of cross-coupling interference, which distorts the storage values (e.g., threshold voltages) of the cells. It is possible to read the storage values of memory cells that potentially cause the cross-coupling interference and use these values to cancel the interference in the interfered cells. This sort of technique typically involves reading large numbers of potentially-interfering cells, and possibly transferring the read values to an external memory controller. The high data throughput needed by such a technique, as well as the increased power consumption, may cause considerable performance degradation.

In most practical cases, however, read errors are caused by a relatively small number of storage values that suffer from severe interference. Other storage values may be mildly distorted, and are thus less likely to cause read errors. In such cases, it is often sufficient to perform interference cancellation on only the severely-interfered storage values. Other storage values can remain without correction with little or no effect on the probability of read errors.

Embodiments of the present invention that are described hereinbelow provide improved methods and systems for canceling cross-coupling interference in arrays of analog memory cells. In some embodiments, a memory system comprises a memory, which comprises multiple analog memory cells, and circuitry that is connected to the memory and carries out programming and reading functions. When retrieving data from a group of cells (e.g., a page), the circuitry identifies a subset of the storage values read from the memory cells in the group that are likely to suffer from severe cross-coupling interference. The severely-interfered storage values are identified based on the known storage values of neighboring cells or other potentially-interfering cells.

The circuitry re-reads the storage values from the cells holding the identified severely-interfered cells using different read thresholds, and cancels the cross-coupling interference using the re-read storage values. The data stored in the group of cells is reconstructed based on the interference-corrected storage values. In some embodiments, interference cancellation and data reconstruction are carried out in a memory controller that is connected to the memory cells by an interface. In these embodiments, the storage values, which were re-read from the cells holding the severely-interfered storage values, are transferred to the memory controller over the interface. This selective transfer of storage values can be implemented using partial read requests, also referred to as random read commands, which are supported by some memory devices.

In summary, the disclosed methods and systems perform interference cancellation by re-reading and transferring the storage values of only a small fraction of the memory cells, which are identified as suffering from severe interference. As such, the achievable reading speed is considerably increased and the current consumption is reduced in comparison with known solutions.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory controller 24, which stores data in a memory device 28 comprising a memory cell array 32. The memory controller and memory device communicate over a suitable interface, such as a bus interface. The memory cell array comprises multiple analog memory cells 36, in which the data is stored. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 36 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 28 comprises a reading/writing (R/W) unit 40, which converts data for storage in the memory device to storage values and writes them into memory cells 36. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 32, R/W unit 40 converts the storage values of memory cells 36 into digital samples having a resolution of one or more bits. Data is typically written to and read from the memory cells in groups that are referred to as pages. Memory device 28 comprises one or more page buffers 44, in which the R/W unit caches data intended for storage and/or data that has been read from array 32.

Memory controller 24 typically encodes the data with an Error Correction Code (ECC) before sending the data to device 28 for storage, and decodes the ECC when retrieving data from device 28. In some embodiments, controller 24 comprises an ECC encoder/decoder 48 for this purpose. Encoder/decoder 48 may apply any suitable type of ECC. The description that follows sometimes refers separately to an ECC encoder and/or to an ECC decoder, regardless of whether the encoder and decoder are implemented in a single unit or in separate units.

The memory controller further comprises a processor 52, which controls the storage and retrieval of data in device 28. In particular, processor 52 controls ECC encoder/decoder 48 and R/W unit 40. Memory controller 24 communicates with a host 30, for accepting data for storage in the memory device and for outputting data retrieved from the memory device. The different elements of controller 24 may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 28 and memory controller 24 are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the memory controller's circuitry may reside on the same die on which the memory array is disposed. Further alternatively, some or all of the functionality of the memory controller can be implemented in software and carried out by a processor or other element of the host system. In some implementations, a single memory controller 24 may be connected to multiple memory devices 28. In yet another embodiment, some or all of the memory controller's functionality may be carried out by a separate unit, referred to as a memory extension, which acts as a slave of memory device 28.

Typically, processor 52 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 36 of array 32 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

Interference Cancellation using Re-Read Opertions

The storage values (e.g., threshold voltages) of the memory cells associated with a given programming level are typically distributed in accordance with a certain statistical distribution. Typically, the stored data is retrieved from the cells by comparing the storage values of the cells to one or more read thresholds. The read thresholds are usually positioned in the boundary regions between adjacent distributions, so that comparing the storage values to the read thresholds is likely to differentiate between storage values belonging to different programming levels.

In some cases, however, the storage values stored in the cells may deviate from the values that were initially written to the cells, because of cross-coupling interference from other cells. Cross-coupling interference in a given cell is often, although not necessarily, caused by neighboring cells. Cross-coupling interference may cause the storage value of a given cell to fall on the wrong side of a read threshold, and may therefore cause read errors.

In some embodiments, system 20 compensates for cross-coupling interference effects by re-reading some or all of the memory cells using different read thresholds. The threshold or thresholds used for re-reading the cells are positioned so as to improve the probability of correct decoding given the interference. For example, if the storage value of a given cell has increased due to cross-coupling interference, then it is desirable to re-read this cell with a read threshold that is higher than the nominal value.

In some techniques, read results pertaining to different read thresholds are combined, such as by computing respective soft metrics for the read storage values using the read results of different thresholds. The soft metrics are subsequently used for decoding the ECC. As another example, the re-read results can be used to determine a subset of the cells that suffer from severe interference, and identify these cells as "erasures" to the ECC decoding process. Several example techniques that compensate for cross-coupling by re-reading the memory cells are described in greater detail, for example, in PCT International Publications WO 2007/132453 and WO 2007/132457, cited above, as well as in PCT International Publications WO 2008/053472 and WO 2008/111058, whose disclosures are incorporated herein by reference.

Efficient Cross-Coupling Interference Cancellation

Embodiments of the present invention that are described herein provide improved methods and systems for canceling cross-coupling interference in arrays of analog memory cells. When performing interference cancellation on a group of cells (e.g., a page), the disclosed methods and systems identify and re-read a subset of the memory cells that are likely to suffer from severe cross-coupling interference, rather than re-reading the entire group of cells. The severely-interfered cells are identified based on the storage values of their neighbors (or other potentially-interfering cells). As a result, the data throughput and current consumption associated with interference cancellation are reduced considerably. Typically but not necessarily, such selective re-reading techniques are invoked only when an initial attempt to read the data fails (e.g., upon ECC failure).

Figure 2:
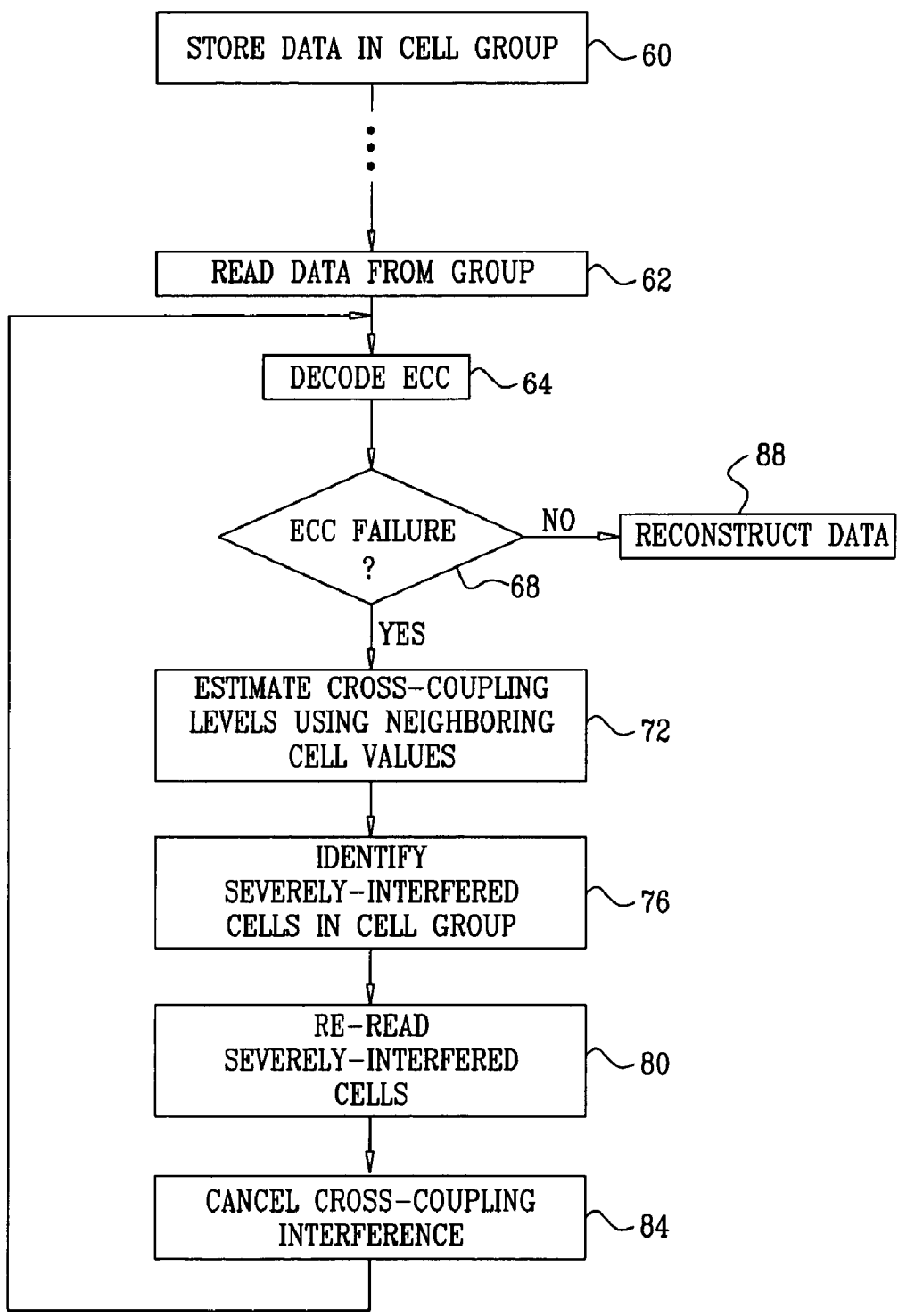
FIG. 2 is a flow chart that schematically illustrates a method for interference cancellation, in accordance with an embodiment of the present invention.

FIG. 2 is a flow chart that schematically illustrates a method for interference cancellation, in accordance with an embodiment of the present invention. The method begins with system 20 storing data in a group of memory cells 36, at a storage step 60. In the description that follows, the group of cells comprises a memory page, although the method is also applicable to various other sorts of cell groups. In the present example, memory cells 36 comprise single-level cells. The memory controller encodes the data of the page with a suitable ECC.

At a later point in time, memory controller 24 is requested to retrieve the data page in question. The memory controller instructs R/W unit 40 to read the page using a nominal read threshold, at a reading step 62. The read results are provided to the memory controller, which attempts to decode the ECC, at an ECC decoding step 64. The memory controller checks whether ECC decoding of the page has succeeded or failed, at an ECC checking step 68. If ECC decoding was successful, the memory controller reconstructs and outputs the data of the page, at a reconstruction step 88, and the method terminates.

If, on the other hand, ECC decoding has failed, system 20 initiates an interference cancellation process. Controller 24 estimates the expected cross-coupling interference levels in the cells of the group, at an interference estimation step 72. The memory controller estimates the cross-coupling interference levels based on the storage values of memory cells that potentially cause interference to the cell group in question. For example, the potentially-interfering cells may comprise cells that neighbor the interfered cell group, e.g., cells in adjacent word lines. When a given word line comprises multiple memory pages (e.g., one page stored in the even-order cells and another page in the odd-order cells of the word line), the potentially-interfering cells may reside on the same word line as the interfered cells. Additionally or alternatively, the potentially-interfering cells may comprise cells within the interfered cell group. Further additionally or alternatively, the potentially-interfering cells may comprise any other suitable cells in the array, whether neighboring or distant from the interfered cells.

Memory controller 24 may obtain the storage values of the potentially-interfering cells in various ways. In some cases, these storage values may be known to the controller a-priori because the pages comprising these cells have been read in the past, or because they have been programmed recently and the corresponding data is still cached in the controller. Alternatively, the memory controller may request unit 40 to read the potentially-interfering cells specifically for the purpose of interference cancellation, and may optionally store the read values for later use.

Having obtained the storage values of the potentially-interfering cells, the memory controller can estimate the cross-coupling interference levels in the cell group in various ways. For example, the memory controller may use a set of pre-defined (e.g., measured or estimated) cross-coupling coefficients, and compute the total cross-coupling contribution of the potentially-interfering cells to a given interfered cell as a function of the cross-coupling coefficients and the storage values of the potentially-interfering cells. In some embodiments, the computation also takes into account the storage values of the interfered cells themselves. Further alternatively, the memory controller may apply any other suitable process for estimating the cross-coupling interference levels in the group of cells based on the storage values of the potentially-interfering cells. The estimation may be based either on soft values read from the potentially-interfering cells, or on hard values (e.g., reconstructed data bits, either before or after ECC correction).

Using the estimated interference levels, the memory controller identifies a subset of the cells in the group that are expected to suffer from severe cross-coupling interference, at a severely-interfered cell identification step 76. (The terms "severely-interfered cells" and "severely-interfered storage values" are used interchangeably herein. The term "severely-interfered cell" is used to refer to a memory cell whose storage value is severely-interfered.) For example, the controller may regard the cells whose estimated cross-coupling interference level exceeds a predefined threshold as severely-interfered cells. In some embodiments, the controller may further classify the severely-interfered cells into cells that suffer from positive interference (i.e., cross-coupling interference that increases the storage value of the cell) and cells that suffer from negative interference (i.e., cross-coupling interference that reduces the storage value of the cell).

Controller 24 notifies memory device 28 of the severely-interfered cells, and R/W unit 40 re-reads the severely-interfered cells using one or more additional read thresholds, at a re-reading step 80. For example, if the nominal read threshold used at step 62 above is denoted TH, the additional read thresholds may comprise two additional thresholds set to TH+$\Delta$ and TH+$\Delta$. Typically, the values of the additional read thresholds are distributed above and below the nominal read threshold. Alternatively, system 20 may use any suitable number of additional read thresholds and any other suitable threshold values.

In some embodiments, memory controller 24 instructs R/W unit 40 to re-read only the severely-interfered cells, which were identified at step 76 above. For example, some Flash devices support partial read commands, which enable the device to read only a specified part of a given page rather than the entire page. In these embodiments, the memory controller instructs the R/W unit to re-read the appropriate subset of cells, and the memory device transfers the results of the partial read operations to the memory controller.

In these embodiments, both the reading time (i.e., the length of time during which the cells are read) and the transfer time (i.e., the length of time during which the re-read results are transferred to the memory controller) are reduced. Re-reading only a subset of the cells in a given page sometimes involves sensing only a subset of the bit lines, which contain the re-read cells. Such partial sensing may reduce the power consumption of the read operation, as well as reduce cell wearing and reading time.

In alternative embodiments, the entire group of cells is read, but only some of the re-read results (comprising the re-read results of the severely-interfered cells) are transferred to the memory controller. In these embodiments, the transfer time is reduced but the reading time typically remains unchanged. In many practical cases, however, the transfer time is dominant in determining the overall data retrieval speed. For example, in some Flash devices, the reading time of an entire 4 Kbyte page is on the order of 25-50 $\mu$S, while the transfer time of an entire page is on the order of 100 $\mu$S. As can be appreciated, reducing the transfer time to a fraction of its size has a considerable effect on the overall data retrieval time.

Device 28 transfers the re-read results to memory controller 24. The memory controller cancels the cross-coupling interference in the storage values read from the severely-interfered cells, using the re-read results of these cells, at a cancellation step 84. For example, the memory controller may select the best-performing re-read result of each severely-interfered cell. Alternatively, the memory controller may combine some or all of the re-read results pertaining to a given severely-interfered cell, with possibly the corresponding read result from step 62 above, to produce a soft decoding metric. The metric is subsequently provided to the ECC decoder, which decodes the ECC using the metrics. Further alternatively, the memory controller may apply any other suitable technique for canceling the cross-coupling interference in the storage values of the severely-interfered cells based on the re-read results of these cells.

The method now loops back to step 64 above, in which the ECC decoder re-attempts to decode the ECC. The memory controller reconstructs the data stored in the cell group, at reconstruction step 88. The controller reconstructs the data from the storage values read from the cells in the group, including the storage values of the severely-interfered cells, after the cross-coupling interference in these values has been canceled at step 84 above.

In the embodiments described herein, various functions are carried out by memory controller 24, and other functions are carried out by R/W unit 40. In alternative embodiments, however, any other suitable division of functions between these two elements can be used. For example, estimation of the cross-coupling levels and identification of the severely-interfered cells can be carried out by the R/W unit, i.e., by circuitry residing in the memory device. Thus, the memory controller and R/W unit can often be viewed as circuitry, which is connected to memory cell array 32 and carries out the disclosed techniques.

In some embodiments, the read results of the potentially-interfering cells (e.g., the read results of neighboring pages) are cached in page buffer 44 in the memory device. In these embodiments, the memory controller may provide the memory device with a rule or criterion, which defines the cells that are to be identified as severely-interfered cells, rather than indicating the specific cells. Often, the memory controller has no way of pointing to the actual cells, since it does not have the read results of the potentially-interfering cells.

For example, the memory controller may instruct the R/W unit to regard any cell, whose vertical neighbor on the next word line is programmed to a given programming level (e.g., the highest programming level in an MLC device), as a severely-interfered cell. In response to such a rule, the R/W unit determines the identities of the severely-interfered cells and re-reads them accordingly. This technique reduces the amount of traffic on the interface between the memory device and the controller considerably. Exemplary logic that may be used for performing such functions in the memory device is described, for example, in PCT International Publication WO 2008/139441, entitled "Memory Device with Internal Signal Processing Unit," whose disclosure is incorporated herein by reference.

The description above refers to a group of single-level cells that is initially read using a single read threshold. This choice, however, was made purely by way of example. The methods and systems described herein are in no way limited to SLC devices, and can be used with memory systems having any suitable number of programming levels and read thresholds.

Selection of Severely-Interfered Cells in Multi-Level Cell (MLC) Devices

In multi-level cells, the cross-coupling interference typically affects cells that are programmed to different programming levels. Cross-coupling cancellation, on the other hand, is typically performed with respect to a certain read threshold (i.e., with respect to the boundary between a specific pair of adjacent programming levels). In some embodiments, memory controller 24 does not re-read all of the severely-interfered cells, but rather focuses on the cells that are relevant to the read threshold in question. This concept is demonstrated in the description of FIG. 3 below.

Figure 3:
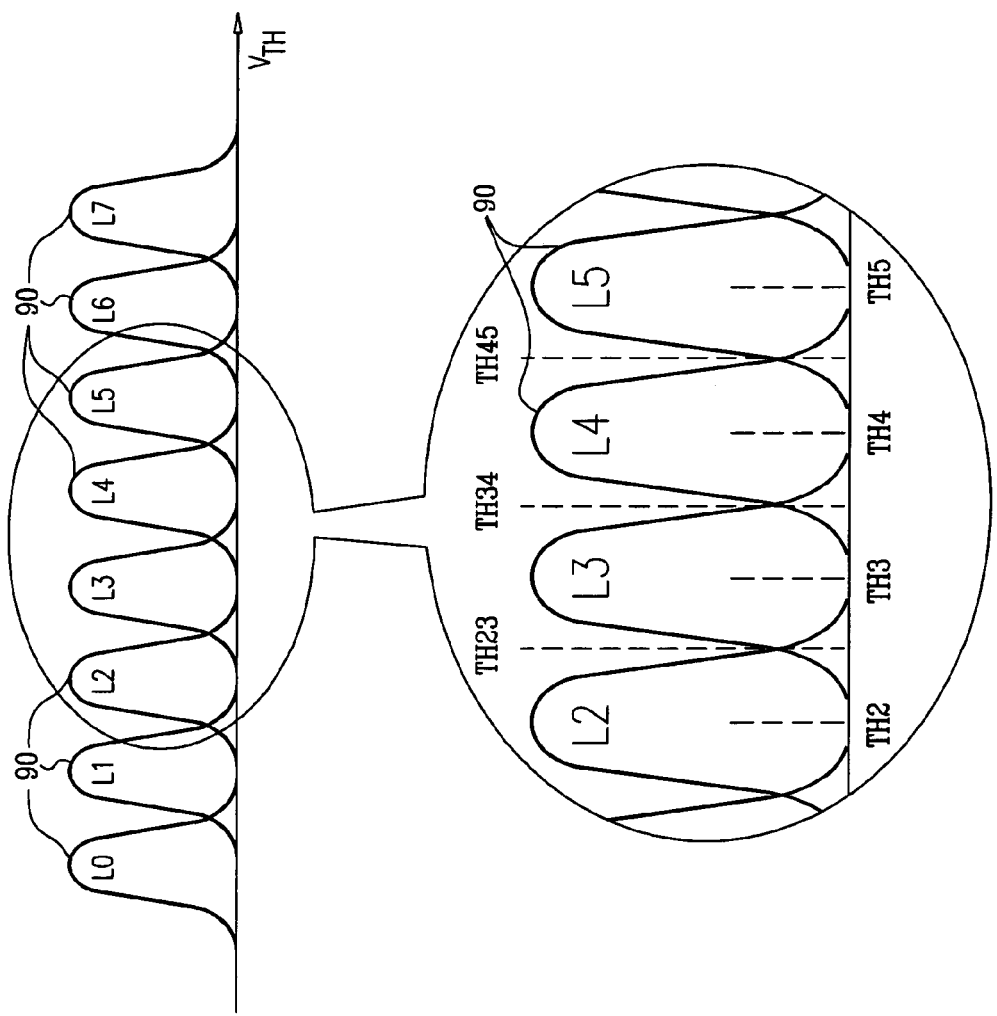
FIG. 3 is a graph that schematically illustrates storage value distributions and read thresholds in a group of analog memory cells, in accordance with an embodiment of the present invention.

FIG. 3 is a graph that schematically illustrates storage value distributions and read thresholds in a group of multi-level analog memory cells, in accordance with an embodiment of the present invention. In the present example, the cells comprise eight-level cells, storing three bits per cell. Each cell is programmed to one of eight programming levels denoted L0 . . . L7. Each level corresponds to a certain combination of three bit values. The storage values in the cells that are programmed to the different programming levels are distributed in accordance with eight distributions 90. In order to retrieve data from the cell group, the cells are read using seven read thresholds, which are positioned in the boundary regions between adjacent programming levels.

Reference is now made to the enlarged section of the figure. Consider, for example, a read operation using a threshold TH34, which differentiates between levels L3 and L4. Read errors in this read operation will occur in (1) cells that have been programmed to level L3 but their storage values fall above TH34 due to cross-coupling interference, and (2) cells that have been programmed to level L4 but their storage values fall below TH34 due to cross-coupling interference. Typically, cells that are programmed to other programming levels (L0 . . . L2, L5 . . . L7) are irrelevant to this particular read operation, and will not cause read errors even if they are subject to severe cross-coupling interference.

Thus, when performing interference cancellation with respect to a given read threshold, controller 24 may re-read and perform interference cancellation on only the severely-interfered cells belonging to programming levels that are adjacent to the read threshold in question. In the present example, controller 24 performs the following re-read operations:

(1) Re-read the severely-interfered cells that are associated with level L4 (i.e., the severely-interfered cells whose storage values are between TH34 and TH45), using an additional read threshold TH4.

(1) Re-read the severely-interfered cells that are associated with level L3 (i.e., the severely-interfered cells whose storage values are between TH23 and TH34), using an additional read threshold TH3.

The memory controller is able to identify the cells that are associated with levels L3 and L4 because it reads the cells using the read thresholds that separate between these levels.

In some embodiments, the controller can further reduce the number of re-read cells by considering whether the cross-coupling interference is positive or negative. For example, in (1) above, the controller may read only the severely-interfered cells in which the interference is negative. In (2) above, the controller may read only the severely-interfered cells in which the interference is positive.

When using this technique, only a fraction of the severely-interfered cells (on the order of $1/7$ in this example) are re-read, leading to a considerable reduction of time and power. Repeating the process for each of the seven read thresholds brings the total number of re-read cells back to equal the number of severely-interfered cells. Typically, in order to establish which cells belong to which programming level, system 20 has to read the cell group using the seven different read thresholds. Although these read operations cause some overhead, the read results can sometimes be reused later, since they represent actual data pages that are stored in the device.

Efficient Requesting of Re-Read Results

As noted above, the memory controller may instruct the memory device to re-read the subset of severely-interfered cells by issuing a partial read request (i.e., a request to read only part of a page). In some embodiments of the present invention, R/W unit 40 and memory controller 24 may apply various techniques to further reduce the amount of data and/or control information that is transferred between the memory device and the memory controller. The description that follows provides several examples of techniques that can be used for this purpose.

A conventional partial read request typically comprises a start command, which specifies the block and page from which a requested data byte is to be read. The start command is followed by an indication of the requested location within the page, an additional cycle for reading the requested byte, and an end command. Transferring re-read results to the memory controller, however, typically involves reading and transferring multiple bytes from the same page. In such a case, specifying the block and page number separately for each requested byte adds an unnecessary overhead.

In some embodiments, the partial read operation can be designed to consume a small number of bus cycles. For example, the memory device can be instructed by the memory controller to enter a dedicated partial read mode. When entering this mode, the memory controller notifies the memory device of the block and page number from which subsequent byte requests are to be read. After entering the dedicated mode, the memory controller sends byte read requests that specify only two address bytes indicating the requested byte location within the page, and then reads the resulting data byte. The start and end commands are omitted, since the block and page numbers are already known to the memory device. (Byte requests comprising two bytes assume that the page size is not greater than $2^{16}=64K$ bytes. For a smaller page size of 8K bytes, thirteen bits are sufficient for specifying the requested byte location.)

In comparison with conventional schemes that send the page and byte address for each requested byte, the number of cycles per byte read operation is reduced by two. In alternative embodiments, the memory controller does not necessarily read each byte immediately after it is requested. For example, the memory controller may send a sequence of requested byte indices, and then read the multiple requested bytes.

When all the requested bytes of a given page have been read, the memory controller instructs the memory device to exit the dedicated mode, such as by sending an illegal byte address that falls outside the valid address range. The memory device interprets illegal byte addresses as an instruction to exit the dedicated read mode. Alternatively, the memory controller and memory device may use any other suitable mechanism for coordinating the transitions into and out of the dedicated read mode.

The partial read requests can be further compressed by specifying the requested byte addresses in a differential manner. In these embodiments, the memory controller requests a certain byte (except the first one) by indicating the offset from the address of the previously-requested byte. Assuming that most of the requested bytes will have an offset from the previously-read byte that is smaller than 255 bytes, one byte per read request can be saved. The memory controller can instruct the memory device to exit such a mode by requesting a byte offset of zero. Generally, the memory controller may issue partial read requests that specify the addresses of the requested data, not necessarily in bytes. For example, the memory controller may specify indices of individual bits or memory cells rather than of bytes. In some embodiments, the memory device refrains from sensing the cells containing the bytes or bits that were not requested, and thus reduces power consumption, cell wearing and reading time.

The embodiments described herein refer mainly to memory pages. The methods and systems described herein may be used, however, with any other suitable groups of memory cells, such as sectors within pages. Although the embodiments described herein mainly address retrieving data from solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory that includes analog memory cells, the method comprising:
    storing data in a group of the analog memory cells by writing respective first storage values to the memory cells in the group;
    after storing the data, reading respective second storage values from the memory cells in the group using one or more first read thresholds;
    identifying third storage values that potentially cause cross-coupling interference in the second storage values, and processing the third storage values so as to identify a subset of the second storage values as severely-interfered storage values;
    selectively re-reading respective fourth storage values from the memory cells holding the severely-interfered storage values using one or more second read thresholds, different from the first read thresholds;
    canceling the cross-coupling interference in the severely-interfered storage values using the re-read fourth storage values; and
    processing the second storage values, including the severely-interfered storage values in which the cross-coupling interference has been canceled, so as to reconstruct the data stored in the group of the memory cells.

2. The method according to claim 1, wherein storing the data comprises encoding the data with an Error Correction Code (ECC), wherein reading the second storage values comprises decoding the ECC, and comprising re-reading the fourth storage values and canceling the cross-coupling interference responsively to a failure in decoding the ECC.

3. The method according to claim 1, wherein processing the third storage values comprises calculating respective expected levels of the cross-coupling interference in the second storage values caused by the third storage values, and selecting the severely-interfered storage values responsively to the expected levels.

4. The method according to claim 1, wherein storing the data comprises programming the memory cells to assume multiple programming levels, wherein reading the second storage values comprises comparing the second storage values to a given read threshold that differentiates between first and second adjacent programming levels, and wherein processing the third storage values comprises selecting the severely-interfered storage values only from among the second storage values corresponding to the first and second programming levels.

5. The method according to claim 1, wherein processing the third storage values comprises determining a classification of the second storage values into a first subset of the second storage values that are increased due to the cross-coupling interference, and a second subset of the second storage values that are decreased due to the cross-coupling interference, and identifying the severely-interfered storage values responsively to the classification.

6. The method according to claim 1, wherein selectively re-reading the fourth storage values comprises refraining from re-reading the fourth storage values from at least some of the memory cells that do not hold the severely-interfered storage values.

7. The method according to claim 1, wherein selectively re-reading the fourth storage values comprises transferring the fourth storage values from the memory cells over an interface to a controller, and wherein canceling the cross-coupling interference comprises canceling the cross-coupling interference in the controller.

8. The method according to claim 7, wherein transferring the fourth storage values comprises transferring over the interface only the fourth storage values that were re-read from the memory cells holding the severely-interfered storage values.

9. The method according to claim 8, wherein selectively re-reading the fourth storage values comprises sensing the fourth storage values of all the memory cells in the group.

10. The method according to claim 8, wherein selectively re-reading the fourth storage values comprises refraining from sensing the fourth storage values of the memory cells that do not hold the severely-interfered storage values.

11. The method according to claim 7, wherein selectively re-reading the fourth storage values comprises sending from the controller over the interface an instruction to enter a predefined reading mode, the instruction indicating the group of the memory cells from which the fourth storage values are to be re-read when operating in the predefined mode.

12. The method according to claim 11, wherein, when operating in the predefined reading mode, selectively re-reading the fourth storage values comprises sending from the controller read requests specifying respective addresses of the fourth storage values within the group, and re-reading the fourth storage values responsively to the read requests.

13. The method according to claim 12, wherein sending the read requests comprises specifying a given address of a given fourth storage value requested in a given read request by specifying in the given read request an offset of the given address from a previous address of a previous fourth storage value requested in a previous read request that precedes the given read request.

14. The method according to claim 7, wherein identifying and processing the third storage values comprise sending from the controller over the interface a criterion for identifying the severely-interfered storage values based on the third storage values, and identifying the severely-interfered storage values responsively to the criterion.

15. A data storage apparatus, comprising:
a memory, which comprises a plurality of analog memory cells; and
circuitry, which is coupled to store data in a group of the analog memory cells by writing respective first storage values to the memory cells in the group, to read respective second storage values from the memory cells in the group using one or more first read thresholds after storing the data, to identify third storage values that potentially cause cross-coupling interference in the second storage values, to process the third storage values so as to identify a subset of the second storage values as severely-interfered storage values, to electively re-read respective fourth storage values from the memory cells holding the severely-interfered storage values using one or more second read thresholds, different from the first read thresholds, to cancel the cross-coupling interference in the severely-interfered storage values using the re-read fourth storage values, and to process the second storage values, including the severely-interfered storage values in which the cross-coupling interference has been canceled, so as to reconstruct the data stored in the group of the memory cells.

16. The apparatus according to claim 15, wherein the circuitry is coupled to encode the stored data with an Error Correction Code (ECC), to decode the ECC responsively to the read second storage values, and to re-read the fourth storage values and cancel the cross-coupling interference responsively to a failure in decoding the ECC.

17. The apparatus according to claim 15, wherein the circuitry is coupled to calculate respective expected levels of the cross-coupling interference in the second storage values caused by the third storage values, and to select the severely-interfered storage values responsively to the expected levels.

18. The apparatus according to claim 15, wherein the circuitry is coupled to program the memory cells to assume multiple programming levels, to read the second storage values by comparing the second storage values to a given read threshold that differentiates between first and second adjacent programming levels, and to select the severely-interfered storage values only from among the second storage values corresponding to the first and second programming levels.

19. The apparatus according to claim 15, wherein the circuitry is coupled to determine a classification of the second storage values into a first subset of the second storage values that are increased due to the cross-coupling interference, and a second subset of the second storage values that are decreased due to the cross-coupling interference, and to identify the severely-interfered storage values responsively to the classification.

20. The apparatus according to claim 15, wherein the circuitry is coupled to refrain from re-reading the fourth storage values from at least some of the memory cells that do not hold the severely-interfered storage values.

21. The apparatus according to claim 15, wherein the circuitry comprises:
a Read/Write (R/W) unit, which is packaged in a memory device comprising the memory cells and which is coupled to selectively re-read the fourth storage values and to export the fourth storage values from the memory device over an interface; and
a memory controller, which is external to the memory device and is coupled to receive the fourth storage values over the interface and to cancel the cross-coupling interference using the received fourth storage values.

22. The apparatus according to claim 21, wherein the R/W unit is coupled to transfer over the interface only the fourth storage values that were re-read from the memory cells holding the severely-interfered storage values.

23. The apparatus according to claim 22, wherein the R/W unit is coupled to selectively re-read the fourth storage values by sensing the fourth storage values of all the memory cells in the group.

24. The apparatus according to claim 22, wherein the R/W unit is coupled to selectively re-read the fourth storage values by refraining from sensing the fourth storage values of the memory cells that do not hold the severely-interfered storage values.

25. The apparatus according to claim 21, wherein the memory controller is coupled to send to the R/W unit an instruction to enter a predefined reading mode, the instruction indicating the group of the memory cells from which the fourth storage values are to be re-read when operating in the predefined mode.

26. The apparatus according to claim 25, wherein, when operating in the predefined reading mode, the memory controller is coupled to send to the R/W unit read requests specifying respective addresses of the fourth storage values within the group, and wherein the R/W unit is coupled to re-read the fourth storage values responsively to the read requests.

27. The apparatus according to claim 26, wherein the memory controller is coupled to specify a given address of a given fourth storage value requested in a given read request by specifying in the given read request an offset of the given address from a previous address of a previous fourth storage value requested in a previous read request that precedes the given read request.

28. The apparatus according to claim 21, wherein the memory controller is coupled to send to the R/W unit a criterion for identifying the severely-interfered storage values based on the third storage values, and wherein the R/W unit is coupled to identify the severely-interfered storage values responsively to the criterion.

* * * * *